(12) United States Patent
Mardi et al.

(10) Patent No.: US 7,285,973 B1
(45) Date of Patent: Oct. 23, 2007

(54) METHODS FOR STANDARDIZING A TEST HEAD ASSEMBLY

(75) Inventors: Mohsen Hossein Mardi, San Jose, CA (US); David M. Mahoney, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 460 days.

(21) Appl. No.: 10/263,491

(22) Filed: Oct. 3, 2002

(51) Int. Cl.
*G01R 31/02* (2006.01)

(52) U.S. Cl. ............... 324/765; 324/754; 324/761

(58) Field of Classification Search ........ 324/754–765; 438/14–18
See application file for complete search history.

(56) References Cited

U.S. PATENT DOCUMENTS

| | | | | |
|---|---|---|---|---|
| 4,609,243 A | * | 9/1986 | Wyss | 439/44 |
| 4,866,375 A | * | 9/1989 | Malloy | 324/754 |
| 4,954,878 A | * | 9/1990 | Fox et al. | 257/675 |
| 5,757,201 A | * | 5/1998 | Partridge et al. | 324/755 |
| 5,977,787 A | * | 11/1999 | Das et al. | 324/761 |
| 6,351,133 B1 | * | 2/2002 | Jones et al. | 324/754 |
| 6,639,420 B1 | * | 10/2003 | Chen et al. | 324/765 |
| 6,819,127 B1 | * | 11/2004 | Hembree | 324/755 |

* cited by examiner

*Primary Examiner*—Vinh P. Nguyen
(74) *Attorney, Agent, or Firm*—William L. Paradice, III; John J. King (57) ABSTRACT

A standardized test head assembly for testing a plurality of integrated circuit dice each having a different bonding pad footprint, the test head assembly including an arrangement of probe holes defined by a predetermined configuration of contact positions, wherein the predetermined configuration defines each of the different bonding pad footprints so that during testing the probe holes align with a subset of the bonding pads for each of the different bonding pad footprints.

20 Claims, 5 Drawing Sheets

METHODS FOR STANDARDIZING A TEST HEAD ASSEMBLY

FIELD OF INVENTION

This invention relates generally to semiconductor device testing, and more specifically to a test head assembly that may be used for testing different integrated circuit dice.

DESCRIPTION OF RELATED ART

A modern wafer fabrication process may form hundreds of identical integrated circuit (IC) devices on a single silicon wafer. Each IC device is formed within a specified die area of the wafer, and typically includes a number of bonding pads that provide power and signal connections to the device. The arrangement of bonding pads on a die is known as the bonding pad footprint. After wafer fabrication, the IC dice are subjected to wafer sort electrical testing to ensure that each IC die functions properly, and are then separated into individual silicon chips. Fully functional chips may be packaged and sold as individual semiconductor devices.

A typical wafer sort test system includes a device tester, a probe card, and a test head assembly. The device tester includes a plurality of test probes that provide test signals to the probe card, which in turn routes the test signals to the test head assembly. The test head assembly is usually mounted on the probe card, and includes a plurality of contact probes to provide the test signals to corresponding bonding pads of an IC die under test. Because the test head assembly and probe card interface between the relatively small bonding pads of the IC die and the much larger probes of the device tester, the probe card and test head assembly are sometimes collectively referred to as a spatial transformer.

During testing, the wafer is placed upon a flat surface of the test system and positioned so that the bonding pads of an IC die under test align with and electrically contact corresponding contact probes of the test head assembly. Test signals generated by the device tester are provided to the die and then analyzed to determine whether the die functions properly. After the die is tested, the wafer is re-positioned so that the bonding pads of another IC die align with and electrically contact the contact probes of the test head assembly, and so on, until all the dice on the wafer are tested.

A problem associated with conventional testing systems is that the arrangement of contact probes on the test head assembly can support only one bonding pad footprint. Thus, if the number and placement of bonding pads on a die do not match the arrangement of contact probes on the test head assembly, the test head assembly cannot be used to test the die. Accordingly, an IC manufacturer of various IC devices that have different die bonding pad footprints must design and fabricate a different test head assembly for each different bonding pad footprint, thereby increasing device testing costs.

In addition, because the design and fabrication of a test head assembly typically requires 8-10 weeks, the time to market for an IC device may be delayed, which in turn may result in a competitive disadvantage. Further, if an outside vendor is employed to design and/or fabricate the test head assembly, the time to market may become dependent upon timely performance of the outside vendor, which may also be disadvantageous.

Thus, there is a need for a universal test head assembly that may be used to test various IC dice having different bonding pad footprints.

SUMMARY

A system and method are disclosed that allow a test head assembly to be used for testing various selected IC dice having different bonding pad footprints. In accordance with one embodiment of the present invention, a universal test head assembly includes an arrangement of probe holes defined by a predetermined configuration of contact positions. The predetermined configuration, which specifies the pattern of and spacing between the contact positions, also defines the bonding pad footprints for the various selected IC dice. In this manner, the different bonding pad footprints of the various selected IC dice and the arrangement of probe holes in the test head assembly may be standardized to the predetermined configuration. Thereafter, the universal test head assembly may be used to test any of the selected dice by selectively populating the probe holes with contact probes according to the die's bonding pad footprint. Because the universal test head assembly is compatible with and may be used for testing IC dice having different bonding pad footprints, the design costs of the universal test head assembly may be spread between different IC dice, which in turn may reduce total testing costs.

For some embodiments, the arrangement of probe holes in the test head assembly may represent a subset of the contact positions of the predetermined configuration, which in turn may represent a subset of one or more of the different standardized bonding pad footprints. For one embodiment, the predetermined configuration may be derived from the bonding pad footprint of a selected die, which in turn may be the IC manufacturers' largest die, the die having the greatest number of bonding pads, or any other die.

In addition, for some embodiments, corresponding subsets of contact holes on the test head assembly and bonding pads on selected IC dice may be reserved for dedicated functions such as, for instance, specified input, output, and power signals. In this manner, similarly positioned contact probes on the test head assembly may be used for dedicated testing functions for various IC dice.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of an exemplary testing system for simplicity only. It is to be understood that embodiments of the present invention are equally applicable to any suitable testing system. Further, the predetermined configuration of contact holes, the arrangement of probe holes in the test head assembly, and the various bonding pads footprints described herein are exemplary. Actual embodiments of the present invention may be used to test IC dice having any suitable bonding pad footprint. Accordingly, the present invention is not to be construed as limited to specific examples described herein but rather includes within its scope all embodiments defined by the appended claims.

Figure 1:
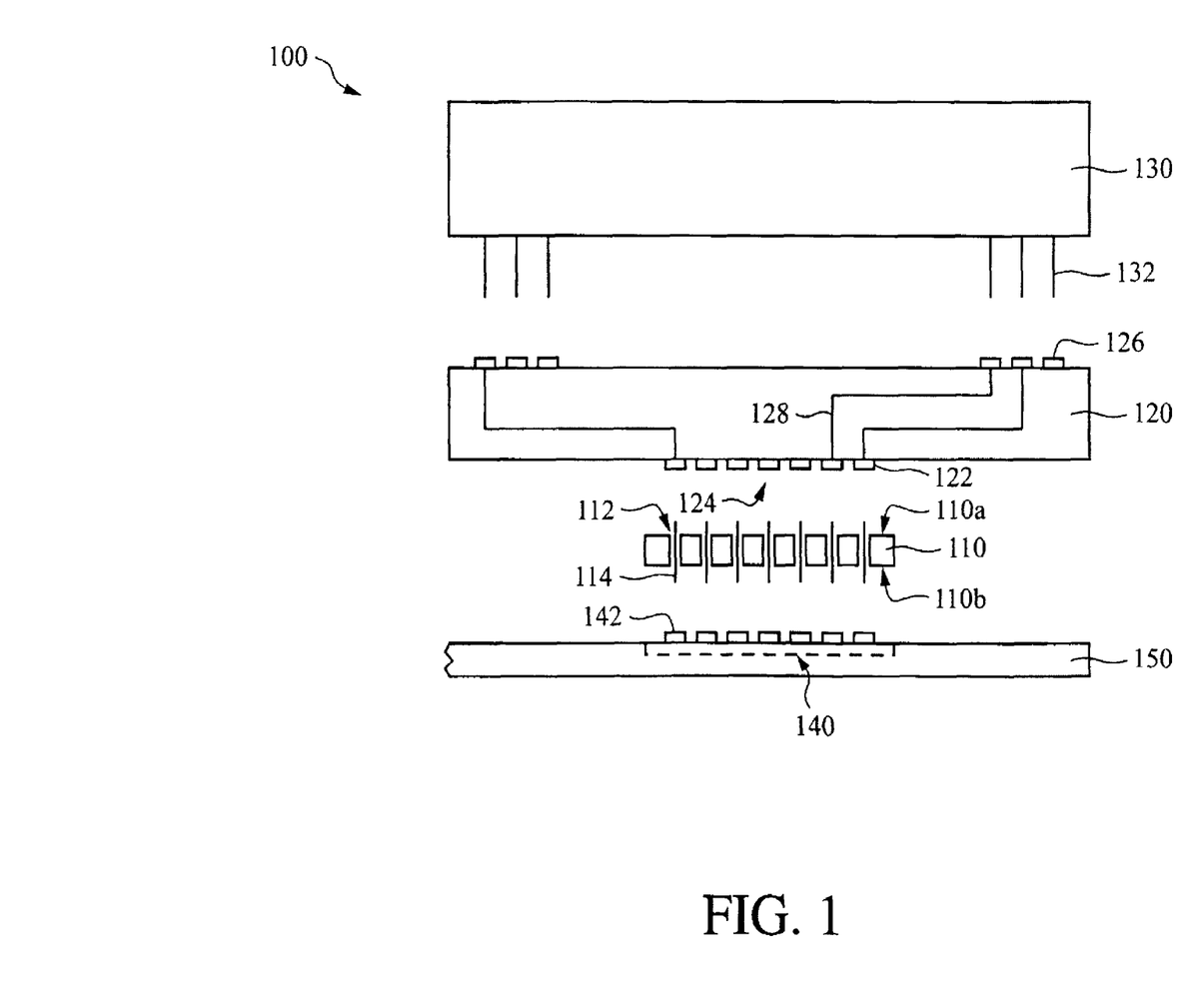
FIG. 1 is an exploded sectional view of a IC testing system within which embodiments of the present invention may be implemented.

FIG. 1 shows an exemplary embodiment of a testing system 100 within which embodiments of the present invention may be utilized. Testing system 100 is shown to include a test head assembly 110, a probe card 120, and a device tester 130 for testing an IC die 140 formed on and/or within a wafer 150. IC die 140 may include any well-known IC circuitry including, for example, memory circuits, processors, programmable gate arrays, logic circuits, and so on. Further, although shown in FIG. 1 as including only one die 140, in actual embodiments, wafer 150 includes many dice formed using well-known wafer fabrication techniques. In addition, as discussed below, the specific type and configuration of test head assembly 110, probe card 120, and device tester 130 may differ in other embodiments of the present invention, and therefore the invention is not limited to specific examples provided herein.

Test head assembly 110 has a pair of opposed surfaces 110a and 110b and a set of probe holes 112 extending between the opposed surfaces. Each probe hole 112 may contain a contact probe 114 having respective ends that extend beyond the opposed probe head surfaces 110a and 110b. As described in detail below, probe holes 112 are arranged according to a predetermined configuration of contact positions that also defines the arrangement of bonding pads 142 formed on die 140 so that so that ends of contact probes 114 extending through test head assembly surface 110b may align with and make electrical contact with corresponding bonding pads 142 of die 140. For simplicity, only a few bonding pads 142 and corresponding contact probes 114 are shown in FIG. 1. For actual embodiments, die 140 may include any number of bonding pads 140, and test head assembly may include any suitable number of contact holes 112 and/or contact probes 114. For some embodiments, each bonding pad 142 mates with a corresponding contact probe 114. For other embodiments, only a subset of bonding pads 142 mates with corresponding contact probes 114.

Contact probes 114 may be any suitable tester probes or contacts. For some embodiments, contact probes 114 include gold-plated titanium tips for contacting corresponding bonding pads 142 of die 140. For other embodiments, contact probes 114 may terminate near surface 110a and be coupled to corresponding contact pads (not shown) disposed on surface 110a. Test head assembly 110 may be constructed of any suitable material. For one embodiment, test head assembly 110 is made of ceramic material. For another embodiment, test head assembly 110 is made of a suitable organic material.

Probe card 120 is a printed circuit board (PCB) adapted to be compatible with test head assembly 110 and with tester 130. For some embodiments, probe card 120 is a circular PCB, although other-shaped probe cards may be used. Probe card 120 includes a first set of contacts 122 formed in a central test area 124. Contacts 122 are formed in a pattern that matches that of contact holes 112 so that when probe head assembly 110 is mounted on probe card 120, contacts 122 align with and make electrical contact with corresponding contact probes 114. First contacts 122 are electrically connected to corresponding second contacts 126 formed on an opposing surface of probe card 120 via electrically conductive paths 128. Contacts 122 and 126 may be any suitable type of contacts, including contact pads, test probes, compressible pogo pins, or other electrical conductors. Conductive paths 128 may be formed on and/or within probe card 120, and may include signal lines or wires, metallic traces, conductive leads, and the like. For simplicity, only a few conductive paths 128 are shown in FIG. 1.

Test head assembly 110 may be aligned with and removably attached to probe card 120 in any well-known manner. Together, test head assembly 110 and probe card 120 interface between tester 130 and IC die 140 to effect a transition between relatively large electrical conductors of tester 110 (e.g., contacts 132) and the relatively small electrical conductors (e.g., bonding pads 142) of die 140.

Although not shown for simplicity, probe card 120 may also include a well-known interface circuit formed or mounted in central test area 124 and coupled to receive and/or process signals transmitted on conductive paths 128. For some embodiments, the interface circuit is coupled between contacts 126 and conductive paths 128. Further, although not shown in FIG. 1, more than one test head assembly 110 may be mounted on probe card 120, as generally known in the art.

Device tester 130 includes a plurality of contacts 132 formed in a pattern compatible with probe card contacts 126 so that tester contacts 132 align with and make electrical contact with probe card contacts 126 when probe card 120 is secured to tester 130 in a well-known manner. Contacts 132 may be any suitable type of contact, including contact pads, test probes, compressible pogo pins, or other electrical conductors. Device tester 130, which may be any suitable automated test equipment (ATE), includes well-known circuitry (not shown for simplicity) to generate and analyze test signals to determine whether an IC die under test (e.g., die 140) functions properly. For one embodiment, device tester 130 is the J750 tester available from Teradyne Inc., although other testers may be used.

During testing, device tester 130 provides power and input test signals destined for die 140 to probe card contacts 126 via tester contacts 132. The signals are routed through probe card 120 to test head assembly 110, which in turn provides the power and test signals to selected die bonding pads 142 via contact probes 114. Output signals from die 140 are routed back to tester 130 via probe card 120 and test head assembly 110 for analysis to determine whether die 140 meets expected electrical characteristics.

In accordance with one embodiment of the present invention, probe holes 112 are formed in one or more test head assemblies 110 in an arrangement defined by a predetermined configuration of contact positions. The predetermined configuration may indicate any suitable number, pattern, and spacing between contact positions. The predetermined configuration of contact positions is also used to define the bonding pad footprints for dice of various selected IC devices to be tested with test head assembly 110. In this manner, the arrangement of probe holes 112 in test head assembly 110 and the bonding pad footprints of the various selected IC dice are standardized to the predetermined configuration of contact positions. For some embodiments, the predetermined configuration of contact positions may be derived from the bonding pad footprint of a selected die. For other embodiments, the predetermined configuration of contact positions may be derived from a subset of the bonding pad footprint of the selected die.

Then, for each die bonding pad footprint defined by the predetermined configuration, one or more of the test head assemblies 110 are selectively populated with contact probes 114 such that during testing contact probes 114 of test head assembly 110 align with and make electrical contact with corresponding bonding pads 142 on the die. For other embodiments, test head assemblies 110 may be fully populated with contact probes 114, and then selected contact probes 114 may be removed such that the remaining contact probes 114 align with and make electrical contact with corresponding bonding pads 142 on the die. For these other embodiments, selected contact probes 114 may be removed using any suitable mechanical or chemical process.

By standardizing the test head assembly and the different bonding pad footprints for various selected IC dice to the predetermined configuration of contact positions, the test head assembly may be used to test many selected IC dice, which in turn allows the design costs of the test head assembly to be spread between various IC devices or families. In addition, because any new devices that utilize a bonding pad footprint defined by the predetermined configuration of contact positions are compatible with the test head assembly, it is not necessary to design a new test head assembly for each new IC device. Therefore, testing costs are minimized for new IC devices. Further, by eliminating the time previously required to design and fabricate new test head assemblies, the time to market for such new devices may be reduced, which in turn provides a competitive advantage. In addition, dependence upon outside vendors for designing and fabricating test head assemblies may be reduced or eliminated.

Figure 2:
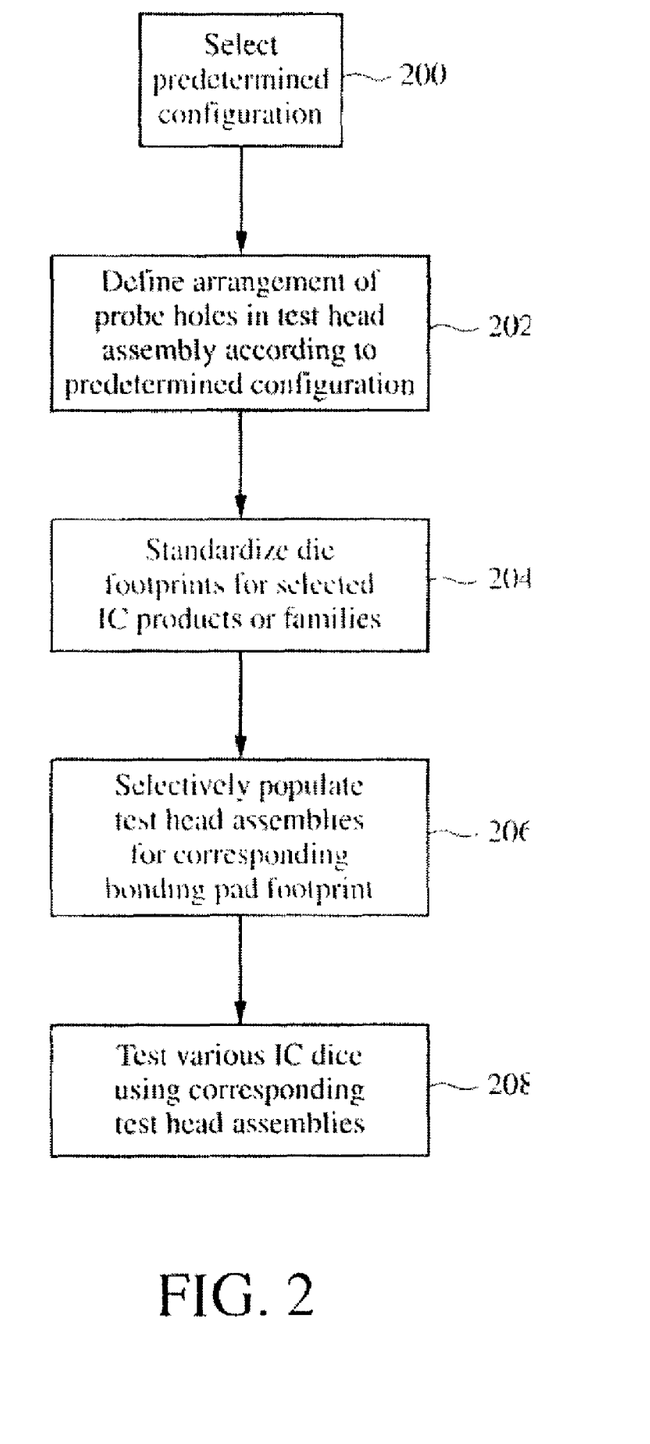
FIG. 2 is a flow chart illustrating operation of one embodiment of the present invention in standardizing the arrangement of probe holes in a test head assembly and different die bonding pad footprints to a predetermined configuration of contact positions.
Figure 3:
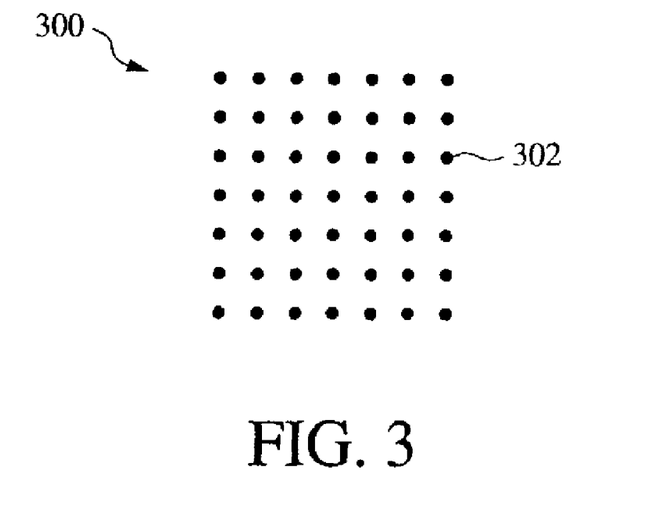
FIG. 3 illustrates an exemplary predetermined configuration of contact positions.

Operation of an exemplary embodiment of the present invention is discussed below with respect to the flow chart of FIG. 2. First, an IC manufacturer of various IC devices requiring different numbers of die bonding pads selects a predetermined pattern of contact positions, an example of which is shown in FIG. 3 (200). For simplicity, the predetermined configuration 300 of FIG. 3 includes a square matrix of 49 contact positions 302. For actual embodiments, the predetermined configuration may have any suitable number of contact positions arranged in any suitable pattern and having any suitable spacing therebetween. As mentioned earlier, for some embodiments, the predetermined configuration may be derived from the bonding pad footprint of a selected IC die from the IC manufacturer.

Figure 4:
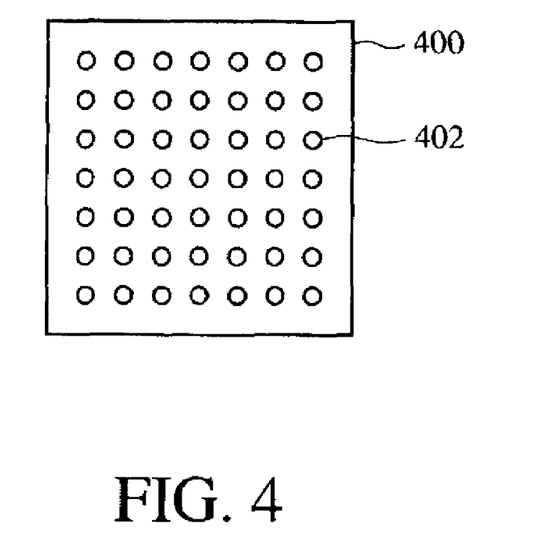
FIG. 4 is a bottom plan view of an exemplary test head assembly having an arrangement of probe holes defined by the predetermined configuration of FIG. 3.

Then, any suitable number of test head assemblies are fabricated to include an arrangement of probe holes defined by the selected predetermined configuration (202). FIG. 4 shows a test head assembly 400 having an arrangement of 49 probe holes 402 defined by the predetermined configuration 300 of FIG. 3. In this manner, probe holes 402 of test head assembly 400 align with corresponding contact positions 302 of predetermined configuration 300. Although the number of probe holes 402 in test head assembly 400 is the same as the number of contact positions 302 in the predetermined configuration 300, in other embodiments, test head assembly 400 may include a smaller number of contact holes 402 that represents a subset of contact positions 302 of predetermined configuration 300.

Figure 5A:
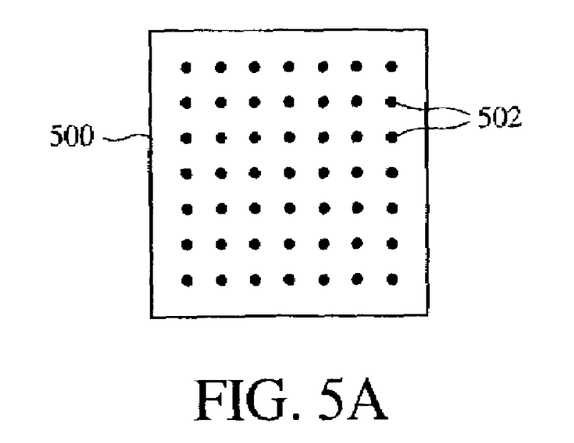
FIG. 5A illustrates a first exemplary bonding pad footprint defined by the predetermined configuration of FIG. 3.
Figure 6A:
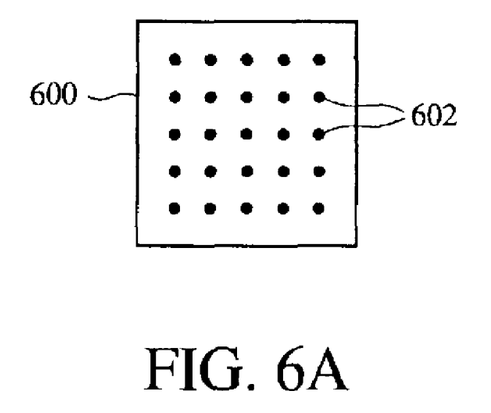
FIG. 6A illustrates a second exemplary bonding pad footprint defined by the predetermined configuration of FIG. 3.

The predetermined configuration is then used to define different die bonding pad footprints corresponding to various selected IC devices (204). The number of bonding pads in each footprint may vary between the selected IC devices as determined, for example, by the size and complexity of the selected devices. For example, FIGS. 5A and 6A show first and second footprints 500 and 600 that are defined by the predetermined configuration 300 of FIG. 3. Footprint 500 includes 49 bonding pads 502 and corresponds to the dice of a first selected IC device, and footprint 600 includes 25 bonding pads 602 and corresponding to the dice of a second selected IC device, where the first IC device may be different from the second IC device. Note that because footprints 500 and 600 are standardized to the predetermined pattern 300, bonding pads 602 of footprint 600 represent a subset of the bonding pads 502 of footprint 500.

In actual embodiments, the number of bonding pads in footprints defined by the predetermined configuration may be greater than the number of contact positions in the predetermined configuration and/or greater than the number of probe holes formed in the corresponding test head assembly. Thus, for some embodiments, the arrangement of probe holes in the test head assembly and/or the arrangement of contact positions in the predetermined configuration may represent subsets of various corresponding bonding pad footprints.

The test head assemblies are then selectively populated with probe contacts according to the bonding pad footprints of the selected IC devices (206). Thus, for each different bonding pad footprint shared by one or more of the selected IC devices, the probe holes of one or more corresponding test head assemblies are populated accordingly and are thereafter suitable for testing the selected IC devices.

Figure 5B:
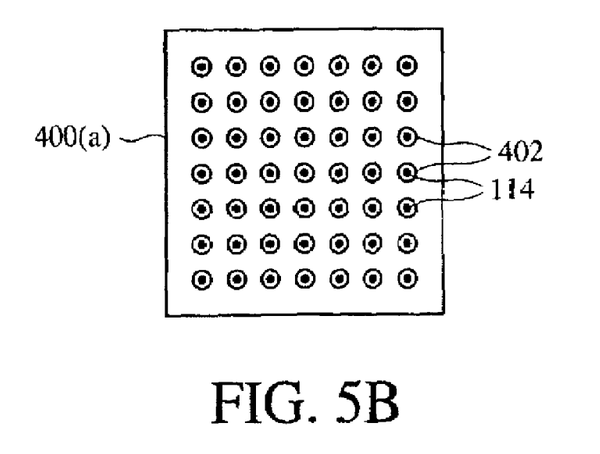
FIG. 5B is a bottom plan view of the test head assembly of FIG. 4 selectively populated with contact probes according to the bonding pad footprint of FIG. 5A.
Figure 5C:
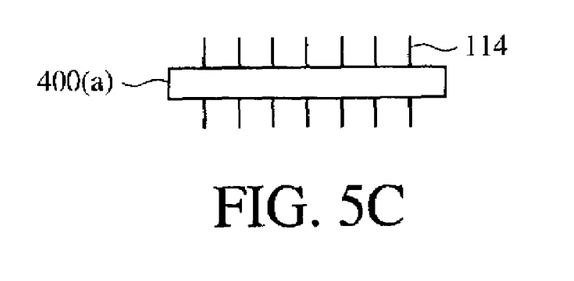
FIG. 5C is side view of the test head assembly of FIG. 5B.

For example, for the bonding pad footprint 500 of FIG. 5A, test head assembly 400 is selectively populated with contact probes 114 as shown in FIGS. 5B and 5C so that all 49 contact holes 402 include a contact probe 114. In this manner, each contact probe 114 of test head assembly 400(a) aligns with and makes electrical contact with a corresponding bonding pad 502 of footprint 500 during testing of dice corresponding to the first IC device.

Figure 6B:
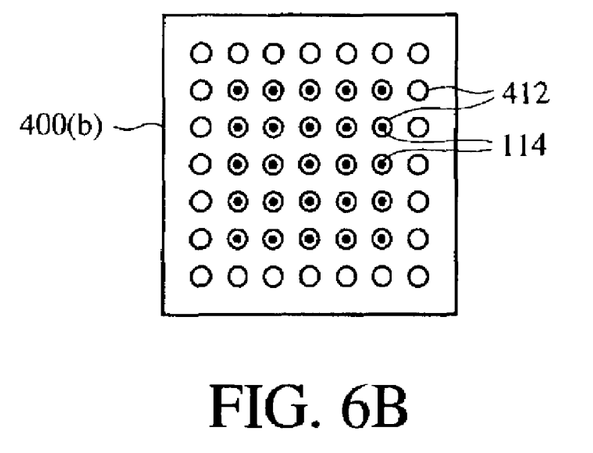
FIG. 6B is a bottom plan view of the test head assembly of FIG. 4 selectively populated with contact probes according to the bonding pad footprint of FIG. 6A.
Figure 6C:
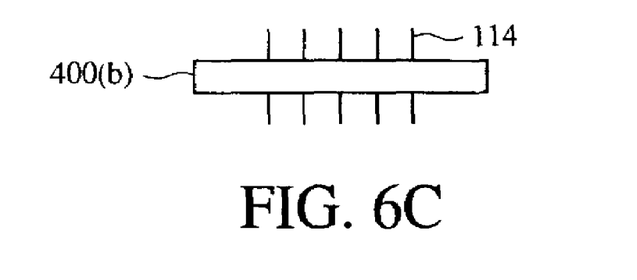
FIG. 6C is side view of the test head assembly of FIG. 6B.

Similarly, for the bonding pad footprint 600 of FIG. 6A, test head assembly 400 is selectively populated with contact probes 114 as shown in FIGS. 6B and 6C so that only a selected 25 of contact holes 402 include a contact probe 114. Thus, probe holes 402 located on the periphery of test head assembly 400(b), which do not correspond to any designated bonding pads 602 of footprint 600, are not populated with contact probes. In this manner, each contact probe 114 of test head assembly 400(b) aligns with and makes electrical contact with a corresponding bonding pad 602 of footprint 600 during testing of dice corresponding to the second IC device.

Thereafter, the test head assemblies populated according to the various bonding pad footprints may be used to test corresponding dice of the selected IC products (208). For example, after test head assembly 400(a) is aligned with and removably mounted on probe card 120, which in turn is aligned with and attached to tester 130, a wafer containing a plurality of dice having bonding pad footprint 500 is positioned below and aligned with test head assembly 400(*a*) so that contact probes 114 of test head assembly 400(*a*) align with and make electrical contact with corresponding bonding pads 502 of a selected die under test.

Similarly, after test head assembly 400(*b*) is aligned with and removably mounted on probe card 120, which in turn is aligned with and attached to tester 130, a wafer containing a plurality of dice having bonding pad footprint 600 is positioned below and aligned with test head assembly 400(*b*) so that contact probes 114 of test head assembly 400(*b*) align with and make electrical contact with corresponding bonding pads 602 of a selected die under test.

In addition, for some embodiments, corresponding subsets of contact holes on the test head assembly and bonding pads on selected IC dice may be reserved for dedicated functions such as, for instance, specified input, output, and power signals. In this manner, similarly positioned contact probes on the test head assembly may be used for dedicated testing functions for various IC dice. For example, referring again to FIGS. 5A and 6A, similarly positioned bonding pads 502 in footprint 500 and bonding pads 602 in footprint 600 may be dedicated for certain testing functions so that during testing, corresponding similarly positions contact probes 114 of test head assemblies 400*a* and 400*b* provide similar test signal and/or power connections to respective dice under test. In this manner, the functions of selected contact probes 114 on test head assemblies 400*a* and 400*b* may be standardized.

Although described above in the context of a test head assembly, embodiments of the present invention are also applicable to other IC testing components and/or architectures. For example, embodiments of the present invention may be used to standardize the leads of an interface structure used for testing various types of packaged IC devices including, for example, ball grid arrays, pin grid arrays, plastic leaded chip carriers, and plastic quad flat packs.

What is claimed is:

1. A method of standardizing a test head assembly to a plurality of different integrated circuit dice, comprising:
   defining a predetermined configuration of contact positions comprising contact positions corresponding to a bonding pad footprint for each integrated circuit die of the plurality of different integrated circuit dice;
   fabricating a test head assembly having an arrangement of probe holes defined by the predetermined configuration of contact positions, each probe hole extending from a first end associated with a contact position of the predetermined configuration of contact positions to a corresponding second end; and
   for each of the different integrated circuit dice,
      defining a bonding pad footprint according to the predetermined configuration of contact positions; and
      selectively populating the probe holes of the test head assembly with contact probes extending through corresponding second ends of the probe holes to enable an electrical connection between bonding pads of the integrated circuit die defined according to the bonding pad footprint and corresponding contacts of a plurality of contacts, wherein the corresponding contacts are defined according to the bonding pad footprint;
   wherein the bonding pad footprint defined for each of the different integrated circuit dice is different from the bonding pad footprints of the other integrated circuit dice in the plurality of different integrated circuit dice.

2. The method of claim 1, wherein the predetermined configuration indicates a pattern of and spacing between the contact positions.

3. The method of claim 1, wherein the bonding pad footprint defined for each of the different integrated circuit dice includes a different number of bonding pads from other bonding pad footprints.

4. The method of claim 1, wherein the selectively populating the probe holes for each of the different integrated circuit dice comprises selectively populating the probe holes for each of the different integrated circuit dice with contact probes according to a subset of the bonding pad footprint.

5. The method of claim 1, wherein for each of the different integrated circuit dice, defining the bonding pad footprint comprises defining the bonding pad footprint to be a subset of the predetermined configuration of contact positions.

6. The method of claim 1, wherein defining the bonding pad footprint of a first integrated circuit die of the plurality of different integrated circuit dice comprises defining the bonding pad of the first integrated circuit die as a subset of the bonding pad footprint defined for a second integrated circuit die of the plurality of different integrated circuit dice.

7. The method of claim 1, further comprising:
   for each of the different integrated circuit dice, selecting corresponding subsets of bonding pads for dedicated functions.

8. The method of claim 1, wherein defining the bonding pad footprint for each of the different integrated dice comprises configuring each of the bonding pad footprints to be compatible with the predetermined configuration.

9. The method of claim 8, wherein the fabricating the test head assembly comprises fabricating the test head assembly having the arrangement of probe holes defined by the predetermined configuration of contact positions indicating a pattern of and spacing between the contact positions of the predetermined configuration.

10. The method of claim 9, wherein the predetermined configuration comprises a subset of the bonding pads of one or more of the bonding pad footprints of the different integrated dice.

11. The method of claim 9, wherein the arrangement of probe holes comprises a subset of the predetermined configuration.

12. The method of claim 9, wherein the arrangement of probe holes comprises a subset of the bonding pad footprints of the different integrated dice.

13. The method of claim 2, wherein the test head assembly is a first test head assembly, the method further comprising:
   fabricating a second test head assembly having an arrangement of probe holes defined by the predetermined configuration;
   selectively populating the probe holes of the first test head assembly with contact probes in an arrangement defined by a first bonding pad footprint corresponding to a first integrated circuit die of the plurality of different integrated circuit dice; and
   selectively populating the probe holes of the second test head assembly with contact probes in an arrangement defined by a second bonding pad footprint corresponding to a second integrated circuit die of the plurality of different integrated circuit dice;
   wherein the first bonding pad footprint is different from the second bonding pad footprint.

14. The method of claim 13, wherein selectively populating the probe holes of the first test head assembly comprises:

selectively inserting the contact probes into the probe holes that correspond to bonding pads of the first integrated circuit die.

15. The method of claim 13, wherein selectively populating the probe holes of the first test head assembly comprises:

inserting the contact probes into all of the probe holes of the first test head assembly; and selectively removing the contact probes that do not correspond to the bonding pads of the first integrated circuit die.

16. The method of claim 15, further comprising:

testing the first integrated circuit die using the first test head assembly; and testing the second integrated circuit die using the second test head assembly.

17. The method of claim 16, wherein:

testing the first integrated circuit die further comprises aligning the contact probes of the first test head assembly with a selected subset of the bonding pads of the first integrated circuit die; and testing the second integrated circuit die further comprises aligning the contact probes of the second test head assembly with a selected subset of the bonding pads of the second integrated circuit die.

18. The method of claim 16, further comprising:

selectively removing from the first test head assembly the contact probes that do not correspond to bonding pads of the second integrated circuit die; and testing the second integrated circuit die using the first test head assembly.

19. The method of claim 13, wherein the predetermined configuration represents a selected subset of the first and second bonding pad footprints.

20. The method of claim 13, further comprising:

selecting corresponding subsets of bonding pads for each footprint to perform one or more dedicated functions.

* * * * *